United States Patent
Chen

(10) Patent No.: US 11,830,540 B2
(45) Date of Patent: Nov. 28, 2023

(54) CIRCUIT FOR SENSING ANTIFUSE OF DRAMS

(71) Applicant: NANYA TECHNOLOGY CORPORATION, New Taipei (TW)

(72) Inventor: Chih-Jen Chen, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 144 days.

(21) Appl. No.: 17/643,838

(22) Filed: Dec. 12, 2021

(65) Prior Publication Data

US 2023/0186973 A1 Jun. 15, 2023

(51) Int. Cl.

| G11C 7/06 | (2006.01) |
|---|---|
| *G11C 11/4091* | (2006.01) |
| *G11C 17/16* | (2006.01) |
| *G11C 29/02* | (2006.01) |
| *G11C 17/18* | (2006.01) |
| G11C 13/00 | (2006.01) |
| G11C 29/00 | (2006.01) |

(52) U.S. Cl.
CPC ........ *G11C 11/4091* (2013.01); *G11C 17/165* (2013.01); *G11C 17/18* (2013.01); *G11C 29/027* (2013.01); *G11C 13/0011* (2013.01); *G11C 29/787* (2013.01)

(58) Field of Classification Search
CPC .............. G11C 11/4091; G11C 17/165; G11C 13/0011; G11C 29/787
See application file for complete search history.

(56) References Cited

U.S. PATENT DOCUMENTS

| 5,231,316 | A | * | 7/1993 | Thelen, Jr. | H03F 1/301 327/513 |
|---|---|---|---|---|---|
| 7,724,600 | B1 | * | 5/2010 | Im | G11C 17/16 365/96 |
| 7,896,545 | B2 | * | 3/2011 | Pan | G01K 15/005 374/178 |
| 2006/0092742 | A1 | * | 5/2006 | Paillet | G11C 17/146 365/207 |
| 2008/0198643 | A1 | * | 8/2008 | Shin | G11C 17/18 365/96 |
| 2010/0124139 | A1 | * | 5/2010 | Dono | G11C 17/165 365/225.7 |
| 2019/0080754 | A1 | | 3/2019 | Tran et al. | |
| 2022/0283601 | A1 | * | 9/2022 | Kundu | G05F 3/262 |

* cited by examiner

*Primary Examiner* — Mushfique Siddique
(74) *Attorney, Agent, or Firm* — CKC & Partners Co., LLC

(57) ABSTRACT

An antifuse circuit includes a current generator and an antifuse sense unit. The current generator has at least one electronic device. The antifuse sense unit is electrically connected to the current generator, and the antifuse sense unit has at least one copied electronic device. An electronic device specification of the at least one electronic device of the antifuse sense unit is equal to an electronic device specification of the at least one copied electronic device of the current generator. The current generator supplies a current to the antifuse sense unit that senses an antifuse.

9 Claims, 1 Drawing Sheet

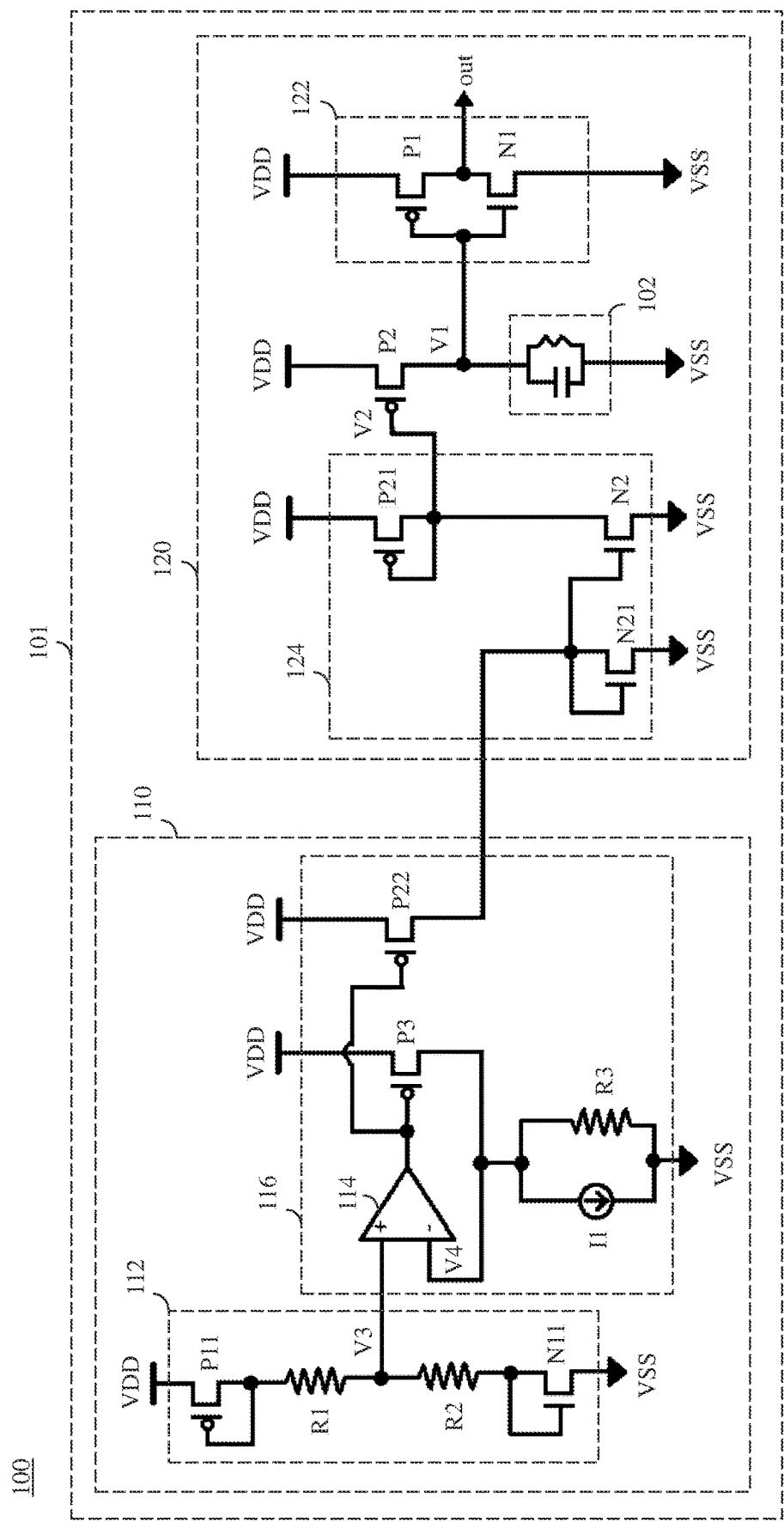

CIRCUIT FOR SENSING ANTIFUSE OF DRAMS

BACKGROUND

Field of Invention

The present invention relates to apparatus to sense antifuse of DRAMs.

Description of Related Art

Currently, the anti-fuse technology is used in DRAM (dynamic random-access memory). An antifuse is an electrical device that performs the opposite function to a fuse. In the DRAM, the antifuse can be programmed to decide a redundant row and a redundant column. For an instance of the antifuse, a blown antifuse has low resistance, and an un-blown antifuse has high resistance.

If the high or low resistance of the antifuse was judged incorrectly, the wrong redundant row and column would be decided, thereby adversely affect the yield of the DRAM.

SUMMARY

An embodiment of the present disclosure is related to an antifuse circuit including a current generator and an antifuse sense unit. The current generator has at least one electronic device. The antifuse sense unit is electrically connected to the current generator, and the antifuse sense unit has at least one copied electronic device. An electronic device specification of the at least one electronic device of the antifuse sense unit is equal to an electronic device specification of the at least one copied electronic device of the current generator. The current generator supplies a current to the antifuse sense unit that senses an antifuse.

Another embodiment of the present disclosure is related to an antifuse circuit, and the antifuse circuit includes a current generator and an antifuse sense unit. The current generator divides a voltage by a voltage divider to provide a divided voltage, and generates a current by a voltage to current unit according to the divided voltage and a simulated voltage. The antifuse sense unit is electrically coupled to the current generator to receive the current, senses an antifuse to generate a sensing result according to the current and outputs the sensing result by an inverter, where a specification of a transistor in the voltage divider is equal to a specification of a transistor in the inverter.

BRIEF DESCRIPTION OF THE DRAWINGS

The invention can be more fully understood by reading the following detailed description of the embodiment, with reference made to the accompanying drawings as follows:

FIG. 1 is a partial block diagram of a DRAM according to some embodiments of the present disclosure.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Referring to FIG. 1, in one aspect, the present disclosure is directed to a DRAM 100, in which an apparatus 101 can sense an antifuse 102 of the DRAM 100. Herewith the DRAM 100 and the apparatus 101 to sense an antifuse 102 are described below with FIG. 1.

The subject disclosure provides the DRAM 100 and the apparatus 101 to sense an antifuse 102 in accordance with the subject technology. Various aspects of the present technology are described with reference to the drawings. In the following description, for purposes of explanation, numerous specific details are set forth in order to provide a thorough understanding of one or more aspects. It can be evident, however, that the present technology can be practiced without these specific details. In other instances, well-known structures and devices are shown in block diagram form in order to facilitate describing these aspects. The word "exemplary" is used herein to mean "serving as an example, instance, or illustration." Any embodiment described herein as "exemplary" is not necessarily to be construed as preferred or advantageous over other embodiments.

FIG. 1 is a partial block diagram of the DRAM 100 according to some embodiments of the present disclosure. As shown in FIG. 1, the DRAM 100 includes the antifuse 102 and the apparatus 101 (e.g., an antifuse circuit) to sense an antifuse 102. The apparatus 101 includes a current generator 110 and an antifuse sense unit 120. As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to.

In structure, the antifuse sense unit 120 is electrically connected to the current generator 110. The current generator 110 has at least one electronic device, and the antifuse sense unit 120 has at least one copied electronic device. It should be noted that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In some embodiments, the electronic device specification of the at least one electronic device of the antifuse sense unit 120 is equal to an electronic device specification of the at least one copied electronic device of the current generator 110, thereby improving the accuracy of sensing the antifuse 102, where the electronic device specification included but not limited to the channel length, channel width, and threshold voltage.

In use, the current generator 110 is configured to generate a current, so that the current generator 110 supplies the current to the antifuse sense unit 120. The antifuse sense unit 120 is configured to receive the current and to sense whether the antifuse 102 is a blown antifuse or an un-blown antifuse, so that the antifuse sense unit 120 can sense the blown antifuse and the un-blown antifuse.

In FIG. 1, the antifuse sense unit 120 includes an inverter 122 that comprises a first PMOS (P type metal oxide semiconductor) transistor P1 and a first NMOS (N type metal oxide semiconductor) transistor N1. It should be noted that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments.

In structure, a source of the first PMOS transistor P1 is electrically coupled with a working voltage VDD, a source of the first NMOS transistor N1 is electrically coupled with a ground voltage VSS, a gate of the first NMOS transistor N1 is electrically connected to the gate of the first PMOS transistor P1, a drain of the first NMOS transistor N1 is electrically connected to the drain of the first PMOS transistor P1.

In FIG. 1, the current generator 110 includes a voltage divider 112, and the voltage divider 112 includes a first copied PMOS transistor P11, a first resistor R1, a second resistor R2 and a first copied NMOS transistor N11 connected in series. In structure, a drain of the first copied PMOS transistor P11 is directly connected to a gate of the first copied PMOS transistor P11, and a drain of the first copied NMOS transistor N11 is directly connected to a gate of the first copied NMOS transistor N11.

In some embodiments, the above-mentioned at least one electronic device of the antifuse sense unit 120 includes the first PMOS transistor P1 and the first NMOS transistor N1 of the inverter 122, and the above-mentioned at least one copied electronic device of the current generator 110 includes the first copied PMOS transistor P11 and the first copied NMOS transistor N11 of the voltage divider 112. The electronic device specification of the first copied PMOS transistor P11 is equal to an electronic device specification of the first PMOS transistor P1, and an electronic device specification of the first copied NMOS transistor N11 is equal to an electronic device specification of the first NMOS transistor N1. In this way, the first copied PMOS transistor P11 and the first copied NMOS transistor N11 copy the first PMOS transistor P1 and the first NMOS transistor N1 respectively, so as to simulate the effect of temperature change and semiconductor process change on the trip point of the inverter 122, so that the accuracy of apparatus 101 to sense the antifuse 102 can be improved.

In FIG. 1, the current generator further includes a PTAT (proportional to absolute temperature) current source I1 and a CTAT (complementary to absolute temperature) resistor R1. In structure, the PTAT current source I1 is electrically coupled with the ground voltage VSS, and the CTAT resistor R3 is electrically coupled with the ground voltage VSS. In practice, the PTAT current source I1 and the CTAT resistor R3 are connected in parallel to simulate electrical characteristics of the antifuse 102, so that the accuracy of apparatus 101 to sense the antifuse 102 can be improved. Specifically, the PTAT current source I1 and the CTAT resistor R3 connected in parallel can simulate the effect of temperature change on the resistance of the blown antifuse. For example, the resistance of blown antifuse does not change with temperature, and therefore the PTAT current source I1 and the CTAT resistor R3 connected in parallel can be a resistance that does not change with temperature.

In FIG. 1, the antifuse sense unit 120 further includes a second PMOS transistor P2. In structure, a source of the second PMOS transistor P2 is electrically coupled with the working voltage, and a drain of the second PMOS transistor P2 is electrically connected to the gate of the first PMOS transistor P1 and the gate of the first NMOS transistor N1. One end of the antifuse 102 is electrically connected to the drain of the second PMOS transistor P2, and another end of the antifuse 102 is electrically coupled with the ground voltage VSS.

In use, the drain of the second PMOS P2 is configured to provide a first voltage V1 for the gate of the first PMOS transistor P1 and the gate of the first NMOS transistor N1 while the gate of the second PMOS P2 receives a second voltage V2. When the antifuse 102 is the blown antifuse, the inverter 122 outputs a logic 1 voltage in response to the blown antifuse. Otherwise, when the antifuse 102 is the un-blown antifuse, the inverter 122 outputs a logic 0 voltage in response to the un-blown antifuse.

In FIG. 1, the current generator further includes an operational amplifier 114, a third PMOS P3 and a second copied PMOS transistor P22. In structure, a non-inverting input end of the operational amplifier 114 is electrically connected between the first resistor R1 and the second resistor R2 of the voltage divider 112, and an inverting input end of the operational amplifier 114 is electrically connected to the PTAT current source I1 and the CTAT resistor R3. A gate of the third PMOS P3 is electrically connected to the output end of the operational amplifier 114, a source of the third PMOS P3 is electrically coupled with the working voltage VDD, and a drain of the third PMOS P3 is electrically connected to the inverting input end of the operational amplifier 114. A gate of the second copied PMOS transistor P22 is electrically connected to the gate of the third PMOS transistor P3 and the output end of the operational amplifier 114, a source of the second copied PMOS transistor P22 is electrically coupled with the working voltage, and a drain of the second copied PMOS transistor P22 is electrically connected to the antifuse sense unit 120.

In some embodiments, the above-mentioned at least one electronic device of the antifuse sense unit 120 further includes the second PMOS transistor P2, the at least one above-mentioned copied electronic device of the current generator 110 includes the second copied PMOS transistor P22, and an electronic device specification of the second copied PMOS transistor P22 is equal to an electronic device specification of the second PMOS transistor P2. In this way, the second copied PMOS transistor P22 copies the second PMOS transistor P2, so that the accuracy of apparatus 101 to sense the antifuse 102 can be improved.

In use, the non-inverting input end of the operational amplifier 114 is configured to receive a third voltage V3 (e.g., a reference voltage) from the voltage divider 112, so that the operational amplifier 114 can be triggered; then, the drain of the second copied PMOS transistor P22 is configured to output the current to the antifuse sense unit 120. The operational amplifier 114 adjusts the current of the third PMOS transistor P3 through the result of comparing the inverting input and the non-inverting input, so that the voltage of the inverting input (i.e., the voltage of the PTAT current source I1 and the CTAT resistor R3 connected in parallel) can be equal to the third voltage V3 of the non-inverting input, in order to copy the trip point of the inverter 122 and the voltage of the antifuse.

In FIG. 1, the antifuse sense unit 120 further includes a current mirror 124. In structure, the current mirror 124 is electrically connected to the drain of the second copied PMOS transistor P22 and is electrically connected to the gate of the second PMOS transistor P2. In use, the current mirror 124 is configured to receive the current from the drain of the second copied PMOS transistor P22 and to provide the second voltage V2 to the gate of the second PMOS transistor P2.

In FIG. 1, the current mirror 124 includes a fourth PMOS transistor P21, a second NMOS transistor N2 and a third NMOS transistor N21. In structure, a source of the fourth PMOS transistor P21 is electrically coupled with the working voltage VDD, and a drain electrically of the fourth PMOS transistor P21 is connected to the gate of the second PMOS transistor P2 and the gate of the fourth PMOS transistor P21. A gate of the second NMOS transistor N2 is electrically connected to the drain of the second copied PMOS transistor P22, a source of the second NMOS transistor N2 is electrically coupled with the ground voltage VSS, and a drain of the second NMOS transistor N2 is electrically connected to the drain of the fourth PMOS transistor P21. A gate of the third NMOS transistor N21 is electrically connected to the drain of the second copied PMOS transistor P22, a source of the third NMOS transistor N21 is electrically coupled with the ground voltage VSS, and a drain of the third NMOS transistor N21 is electrically connected to the gate of the third NMOS transistor N21, the gate of the second NMOS transistor N2 and the drain of the second copied PMOS transistor P22.

In use, the drain of the third NMOS transistor N21 is configured to receive the current from the drain of the second copied PMOS transistor P22, and the drain of the fourth PMOS transistor P21 is configured to provide the second voltage V2 for the gate of the second PMOS transistor P2.

In some embodiments, the current mirror 124 generates the second voltage V2 for the gate of the second PMOS transistor P2, so as to solve or circumvent the problem of the change of the gate-to source voltage (Vgs) and resistance of the second PMOS transistor P2 caused by the power IR drop. In a control experiment, the current generator 110 and the antifuse sense unit 120 are placed in different positions of the DRAM 100, the distance between the current generator 110 and the antifuse sense unit 120 is very long, and the current mirror 124 is omitted from the antifuse sense unit 120; thus, the VDD IR drop results in the difference between the working voltage VDD of the current generator 110 and the working voltage VDD of the antifuse sense unit 120, thereby causing the change of the Vgs and resistance of the second PMOS transistor P2, and this result may misjudge the blown and un-blown states of the antifuse 102.

In a control experiment, the current mirror 124 is omitted from the antifuse sense unit 120, and the first copied PMOS transistor P11, the first copied NMOS transistor N11, the PTAT current source I1, the CTAT resistor R3, the operational amplifier 114, the third PMOS P3 and the second copied PMOS transistor P22 are omitted from the current generator 110. Therefore, in this control experiment, the current generator has a voltage divider consisting of the first resistor R1 and the second resistor R2 only so as to provide a voltage across the second resistor R2 for the gate of the second PMOS transistor P2; this voltage does not change with temperature change and semiconductor process change, but the threshold voltages of the first PMOS transistor P1, the first NMOS transistor N1 and the second PMOS transistor P2 change with the temperature change and the semiconductor process change. Therefore, in this control experiment, it is possible to misjudge the blown state of the antifuse 102 as the un-blown state.

In some embodiments, the current generator 110 divides a voltage (e.g., the working voltage VDD) by a voltage divider 112 to provide a divided voltage (e.g., the third voltage V3), and generates a current by a voltage to current unit 116 according to the divided voltage and a simulated voltage V4. The antifuse sense unit 120 is electrically coupled to the current generator 110 to receive the current, senses the antifuse 102 to generate a sensing result according to the current and outputs the sensing result by the inverter 122, where a specification of a transistor in the voltage divider 112 is equal to a specification of a transistor in the inverter 122.

In some embodiments, the transistor (e.g., the first copied PMOS transistor P11) in the voltage divider 112 and the transistor (e.g., the first PMOS transistor P1) in the inverter 122 are P-type transistors.

In some embodiments, the transistor (e.g., the first copied NMOS transistor N11) in the voltage divider 112 and the transistor (e.g., the first NMOS transistor N1) in the inverter 122 are N-type transistors.

In some embodiments, the voltage to current unit 116 includes the PTAT current source I1 and the CTAT resistor R3 electrically connected in parallel to provide the simulated voltage V4.

In some embodiments, the voltage to current unit 116 includes the operational amplifier 114 and an output transistor (e.g., the second copied PMOS transistor P22). The operational amplifier 114 receives the divided voltage (e.g., the third voltage V3) and the simulated voltage V4. The output transistor (e.g., the second copied PMOS transistor P22) is electrically coupled to the operational amplifier 114, where the output transistor is controlled by the operational amplifier 114 to output the current.

In some embodiments, the antifuse sense unit 120 includes a sensing transistor (e.g., the second PMOS transistor P2). The sensing transistor is electrically coupled to the antifuse 102, and senses the antifuse 102 according to the current from the current generator 110.

In some embodiments, the antifuse sense unit 120 includes the current mirror 124 electrically coupled to the output transistor (e.g., the second copied PMOS transistor P22) and the sensing transistor (e.g., the second PMOS transistor P2), where the current mirror 124 receives the current to control the sensing transistor.

In some embodiments, a specification of the output transistor (e.g., the second copied PMOS transistor P22) is equal to a specification of the sensing transistor (e.g., the second PMOS transistor P2).

In some embodiments, the output transistor (e.g., the second copied PMOS transistor P22) and the sensing transistor (e.g., the second PMOS transistor P2) are P-type transistor.

In view of the above, according to the present disclosure, the DRAM 100 and the apparatus 101 can improve the accuracy of sensing the antifuse 102.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An antifuse circuit, comprising:
    a current generator, dividing a voltage by a voltage divider to provide a divided voltage, generating a current by a voltage to current unit according to the divided voltage and a simulated voltage; and
    a antifuse sense unit, electrically coupled to the current generator to receive the current, sensing an antifuse to generate a sensing result according to the current and outputting the sensing result by an inverter;
    wherein a channel length, a channel width, and a threshold voltage of a transistor in the voltage divider is equal to a channel length, a channel width, and a threshold voltage of a transistor in the inverter.

2. The antifuse circuit of claim 1, wherein the transistor in the voltage divider and the transistor in the inverter are P-type transistors.

3. The antifuse circuit of claim 1, wherein the transistor in the voltage divider and the transistor in the inverter are N-type transistors.

4. The antifuse circuit of claim 1, wherein the voltage to current unit comprises a PTAT current source and a CTAT resistor electrically connected in parallel to provide the simulated voltage.

5. The antifuse circuit of claim 4, wherein the voltage to current unit comprises:
   an operational amplifier receiving the divided voltage and the simulated voltage; and
   an output transistor electrically coupled to the operational amplifier, wherein the output transistor is controlled by the operational amplifier to output the current.

6. The antifuse circuit of claim 5, wherein the antifuse sense unit comprises a sensing transistor electrically coupled to the antifuse, sensing the antifuse according to the current from the current generator.

7. The antifuse circuit of claim 6, wherein the antifuse sense unit comprises a current mirror electrically coupled to the output transistor and the sensing transistor, wherein the current mirror receives the current to control the sensing transistor.

8. The antifuse circuit of claim 6, wherein a channel length, a channel width, and a threshold voltage of the output transistor is equal to a channel length, a channel width, and a threshold voltage of the sensing transistor.

9. The antifuse circuit of claim 8, wherein the output transistor and the sensing transistor are P-type transistors.

\* \* \* \* \*